United States Patent [19]
Nakaya et al.

[11] Patent Number: 4,920,402
[45] Date of Patent: Apr. 24, 1990

[54] INTEGRATED CIRCUIT DEVICE

[75] Inventors: Masao Nakaya; Yasutaka Horiba, both of Itami, all of Japan

[73] Assignee: Mitsubishi Denki Kabushiki Kaisha, Tokyo, Japan

[21] Appl. No.: 251,768

[22] Filed: Oct. 3, 1988

[30] Foreign Application Priority Data

Feb. 15, 1988 [JP] Japan .................. 63-33221

[51] Int. Cl.⁵ .......................................... H01L 27/02
[52] U.S. Cl. ........................................ 357/68; 357/40
[58] Field of Search ............ 357/40, 68, 71 P, 59 R, 357/4, 59 F; 437/174, 915

[56] References Cited

U.S. PATENT DOCUMENTS 4,766,516 8/1988 Ozdemir et al. ................ 357/40

OTHER PUBLICATIONS

"Three-Dimentional IC Trends", Yoichi Akasaka, Proceedings of the IEEE, vol. 74, No. 12, Dec. 1986, pp. 1703, 1707 and 1708.

Primary Examiner—Andrew J. James
Assistant Examiner—Mark Prenty
Attorney, Agent, or Firm—Oblon, Spivak, McClelland, Maier & Neustadt

[57] ABSTRACT

The present invention is directed to an integrated circuit having multilayer structure. In the present invention, dummy elements having no relation to the operation of an integrated circuit are formed on the upper surface of a substrate provided with the integrated circuit by the same material as that for the substrate, to thereby prevent the integrated circuit provided on the substrate from direct and correct observation. As the result, formation arrangement etc. of the integrated circuit cannot be easily analyzed, whereby interests of those contributing to technology development can be sufficiently protected.

6 Claims, 4 Drawing Sheets

INTEGRATED CIRCUIT DEVICE

BACKGROUND OF THE INVENTION

1. Field of the Invention

The present invention relates to an integrated circuit device having multilayer structure, and more particularly, it relates to the structure of an integrated circuit device comprising a substrate and an integrated circuit formed thereon, which can prevent leakage of secret matters due to difficulty in analysis of formation, arrangement, etc., of the integrated circuit.

2. Description of the Background Art

FIG. 4 is a typical sectional view showing an example of a conventional semiconductor integrated circuit device.

Referring to FIG. 4, a semiconductor substrate 1 of single-crystalline silicon or the like is provided on one major surface thereof with an integrated circuit 2 which has electronic devices such as transistors and resistors. The integrated circuit 2 is connected to an external circuit (not shown) through bonding pads 3 which are provided by evaporating aluminum or the like on the substrate 1. A protective film 4 of resin or the like is formed on the surface of the integrated circuit 2.

In such an integrated circuit device, the integrated circuit 2 of high density must be formed on the substrate 1, the area of which is limited. Therefore, much labor and cost are required in order to increase the degree of integration by improving formation of the integrated circuit 2 and device arrangement. Thus, formation, arrangement etc. of such an integrated circuit must be kept secret for each manufacturer.

In the conventional integrated circuit device, however, only the protective film 4 is provided on the integrated circuit 2. Therefore, if the protective film 4 is highly transparent, the integrated circuit 2 formed on the substrate 1 can be directly observed in an enlarged manner through a microscope or the like. Even if the protective film 4 is made of opaque resin, the integrated circuit 2 can be observed similarly to the above by removing the protective film 4 by a method such as etching.

Thus, secret matters such as formation and arrangement of the integrated circuit 2 provided on the substrate 1 are easily analyzed by a third party or the like, to spoil efforts and interests of those rendering services to development of such technique.

SUMMARY OF THE INVENTION

The present invention is directed to an integrated circuit device having multilayer structure.

The integrated circuit device according to the present invention comprises a substrate, a prescribed integrated circuit formed on one major surface of the substrate, an insulating layer formed on the integrated circuit, dummy elements provided on prescribed regions of the insulating layer and formed by the same material as that for the integrated circuit, a protective film formed on the insulating layer to cover the dummy elements, bonding holes formed in the upper surface of the protective film to reach upper surface parts of the integrated circuit through the insulating film while avoiding the region provided with the dummy elements and bonding pads formed in the bonding holes to have upper ends exposed from the upper surface of the protective film and lower ends electrically connected to the integrated circuit.

Accordingly, a principal object of the present invention is to provide an integrated circuit device which substantially disables correct observation of an integrated circuit formed on a substrate to allow no analysis of formation, arrangement etc. of the integrated circuit, to thereby sufficiently protect the interests of those contributing to technology development.

According to the present invention, dummy elements having no relation to the operation of an integrated circuit are formed on the upper surface of a substrate provided with the integrated circuit by the same material as that for the substrate, to thereby prevent the integrated circuit provided on the substrate from being directly and correctly observed. As the result, formation, arrangement etc. of the integrated circuit cannot be easily analyzed, whereby the interests of those rendering services to technology development can be sufficiently protected.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
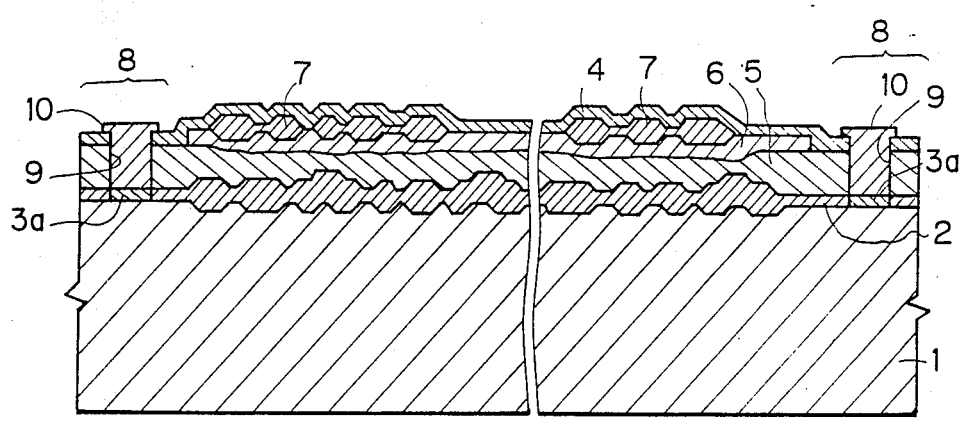
FIG. 1 is a typical sectional view showing an integrated circuit device according to an embodiment of the present invention.
Figure 2:
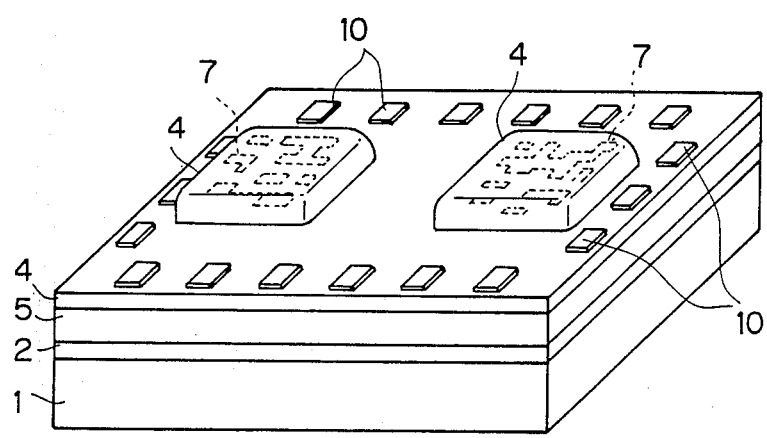
FIG. 2 is a perspective view of the integrated circuit device shown in FIG. 1.

FIG. 1 is a typical sectional view showing an integrated circuit device according to an embodiment of the present invention, and FIG. 2 is a perspective view of the integrated circuit device shown in FIG. 1.

Referring to FIGS. 1 and 2, an integrated circuit 2 is formed on one major surface of a semiconductor substrate 1 made of single-crystalline silicon or the like, and an insulating layer 5 is formed on the integrated circuit 2. Further, a dummy element forming layer 6 is formed by single-crystalline silicon on a prescribed region of the insulating layer 5, to be provided on its upper layer part with a plurality of dummy elements 7 which perform no substantial operation. A protective film 4 is formed on the insulating layer 5, to cover the dummy element forming layer 6 from above.

In pad regions 8 provided with no dummy element forming layer 6, a plurality of bonding holes 9 are defined in the upper surface of the protective film 4 to reach upper surfaces of pad contact portions of the integrated circuit 2 through the insulation film 5, to be provided therein with bonding pads 10 respectively.

The procedure for manufacturing the inventive integrated circuit device will be described below.

Figure 3A:
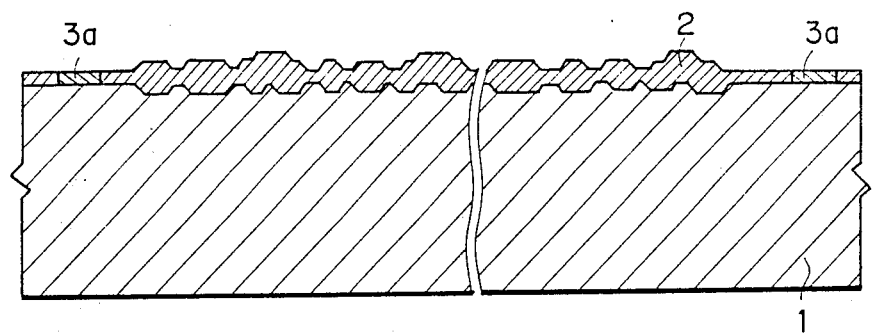
FIGS. 3A to 3F illustrate the procedure of manufacturing the integrated circuit device shown in FIG. 1.
Figure 3B:
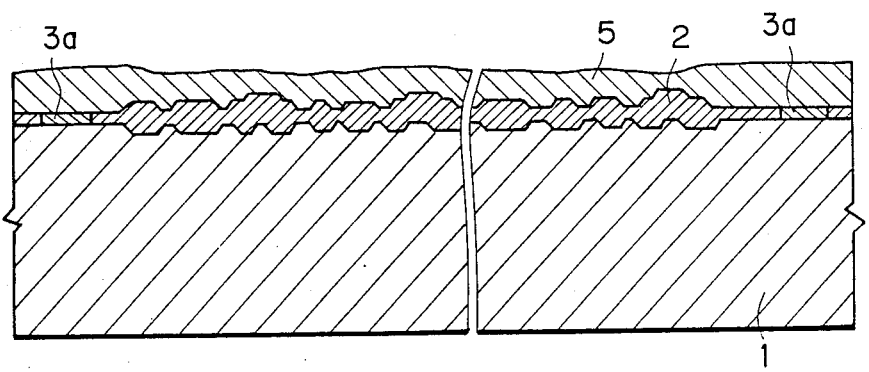

First, the integrated circuit 2, the pad contact portions 3a thereof and the like are first formed on the substrate 1 which is in a wafer state as shown in FIG. 3A, and then the upper surface of the substrate 1 is covered with the insulating layer 5 as shown in FIG.

3B. The pad contact portions 3a are formed by evaporation of aluminum etc. and the insulating layer 5 is prepared by an SiO$_2$ layer, which is obtained by thermal oxidation of silicon, or the like.

Figure 3C:
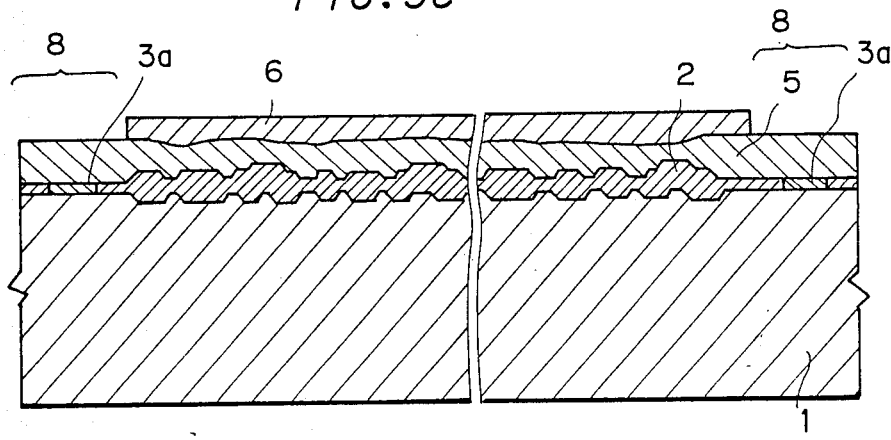
Figure 3D:
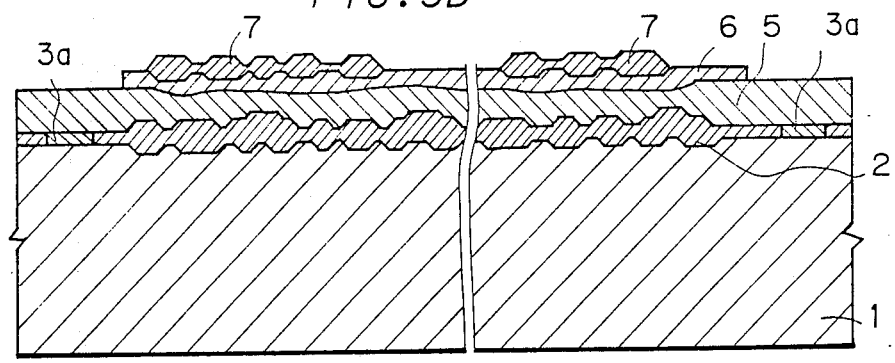
Figure 3E:
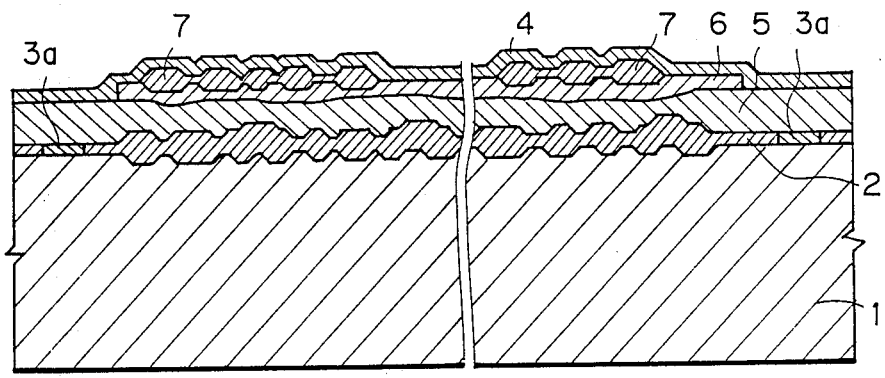

Then, polycrystal silicon is deposited on the insulating layer 5 by decompression CVD process or the like and the poly crystalline silicon is monocrystallized by a laser annealing zone melting method to form the dummy element forming layer 6, as shown in FIG. 3C. Within the dummy element forming layer 6, at least portions provided on the pad regions 8, i.e., upper parts of the pad contact portions 3a, are removed by etching. Thereafter the dummy elements 7 are formed on the upper layer part of the dummy element forming layer 6, as shown in FIG. 3D. Then, resin is applied from above the dummy element forming layer 6 to provide the protective layer 4, as shown in FIG. 3E.

Figure 3F:
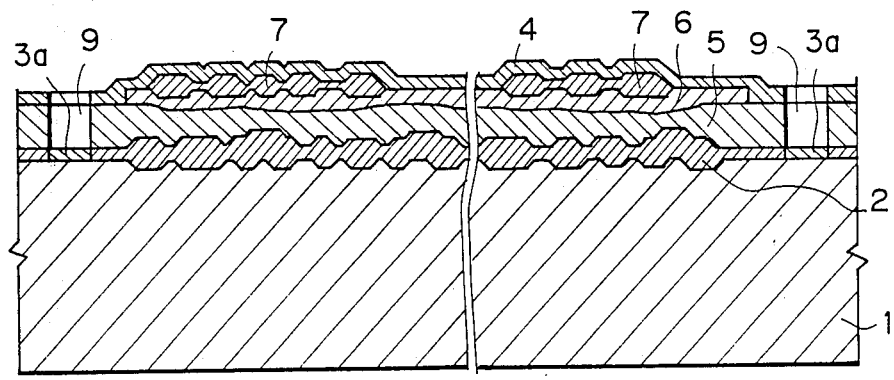
Figure 4:
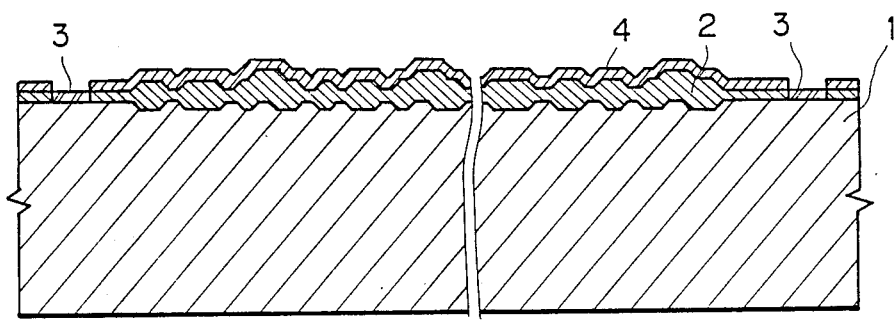
FIG. 4 is a typical sectional view showing a conventional integrated circuit device.

Thereafter parts of the insulating layer 5 and the protective film 4 stacked on the pad contact portions 3a are selectively removed by etching or the like to form a plurality of bonding holes 9, as shown in FIG. 3F. Then, aluminum or the like is evaporated over the entire surface from above the protective film 4 and selectively removed by etching to form the bonding pads 10, wires (not shown) and the like. Thereafter the substrate 1 being in the wafer state is cut to provide the integrated circuit device shown in FIG. 1.

Upon completion of these steps, the integrated circuit device is connected with external wires (not shown) through the bonding pads 10 and subjected to packaging etc. as a product.

In this integrated circuit device, operation is determined by the integrated circuit 2 provided on the substrate 1, and the insulating layer 5 prevents malfunction of the integrated circuit 2 caused by electrical interaction with the dummy element forming layer 6. The dummy elements 7 are provided for the purpose of camouflage, with no relation to the operation of the integrated circuit 2. Thus, the dummy elements 7 can be prepared by electronic devices such as transistors or resistors, with arbitrary structure and relation of connection.

In the integrated circuit device having the aforementioned structure, the dummy elements 7 formed on the dummy element forming layer 6 serve as visual obstacles. Further, the dummy elements 7 may be prepared by electronic devices as hereinabove described, so that the same cannot be easily distinguished from the elements in the integrated circuit 2. Thus, the integrated circuit 2 provided on the substrate 1 cannot be correctly observed from above the protective film 4. Further, since the dummy element forming layer 6 is formed of silicon, i.e., the same material as that for the substrate 1, it is difficult to remove only the dummy element forming layer 6 by a method such as etching. Thus, secret matters such as formation and arrangement of the integrated circuit 2 provided on the substrate 1 are sufficiently protected.

Although the dummy element forming layer 6 is made of single-crystalline silicon in the above embodiment, the present invention is not restricted to this but the poly crystalline silicon deposited on the insulating layer 5 may be directly employed.

Further, the present invention is not restricted to a semiconductor integrated circuit device, but is also applicable to other integrated circuits such as a film integrated circuit device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated circuit device having multilayer structure, comprising:
    a substrate;
    an integrated circuit formed on one major surface of said substrate;
    an insulating layer formed on said integrated circuit;
    dummy elements provided on a prescribed region of said insulating layer and formed by the same material as that for said integrated circuit;
    a protective film formed on said insulating layer to cover said dummy elements;
    bonding holes formed in the upper surface of said protective film to reach upper surface parts of said integrated circuit through said insulation layer while avoiding said region provided with said dummy elements; and
    bonding pads formed in said bonding holes to have upper ends exposed from the upper surface of said protective film and lower ends electrically connected to said integrated circuit.

2. An integrated circuit device in accordance with claim 1, wherein
    said substrate is a semiconductor substrate mainly composed of single-crystalline silicon.

3. An integrated circuit device in accordance with claim 2, wherein
    said dummy elements are mainly composed of poly crystalline silicon.

4. An integrated circuit device in accordance with claim 2, wherein
    said dummy elements are mainly composed of single-crystalline silicon.

5. An integrated circuit device in accordance with claim 4, wherein
    said single-crystalline silicon of said dummy elements is formed by monocrystallizing poly crystalline silicon by a laser annealing zone melting method.

6. An integrated circuit device in accordance with claim 4, wherein
    said dummy elements are formed by electronic devices.

* * * * *